United States Patent
Sundaram et al.

(10) Patent No.: US 6,614,210 B2
(45) Date of Patent: Sep. 2, 2003

(54) VARIABLE VOLTAGE SOURCE FOR A FLASH DEVICE OPERATING FROM A POWER-SUPPLY-IN-PACKAGE (PSIP)

(75) Inventors: Rajesh Sundaram, Fair Oaks, CA (US); Jahanshir J. Javanifard, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/026,593

(22) Filed: Dec. 18, 2001

(65) Prior Publication Data

US 2003/0111988 A1 Jun. 19, 2003

(51) Int. Cl.$^7$ .................................................. H02J 3/12
(52) U.S. Cl. ...................................................... 323/354
(58) Field of Search ................................. 323/354, 222, 323/351, 369, 293, 297

(56) References Cited

U.S. PATENT DOCUMENTS

| | | | |
|---|---|---|---|
| 3,533,010 A | | 10/1970 | Bowles |
| 3,736,496 A | | 5/1973 | Lachocki |
| 4,347,474 A | * | 8/1982 | Brooks et al. ............... 307/110 |
| 4,810,948 A | * | 3/1989 | Takuma ....................... 323/280 |
| 5,497,119 A | | 3/1996 | Tedrow et al. |
| 5,768,115 A | * | 6/1998 | Pascucci et al. ............ 307/110 |
| 6,097,628 A | * | 8/2000 | Rolandi .................. 365/185.03 |
| 6,175,218 B1 | * | 1/2001 | Choi et al. ............. 365/185.03 |

OTHER PUBLICATIONS

U.S. patent application 2002/0089317 A1 to Khouri et al., Pub Date Jul. 02.
Bill Slack, Xicor, Inc. "Designing Power SUpplies Using Xicor's XDCP Mixed Signal Products" Jan. 01, pp. 1–22.
Xicor, Inc. "Digitally–Controlled (XDCP) Potentiometer", Nov. 99, pp. 1–10.

* cited by examiner

Primary Examiner—Shawn Riley
(74) Attorney, Agent, or Firm—Blakely, Sokoloff, Taylor & Zafman LLP

(57) ABSTRACT

A system includes a processor and a flash memory block that may receive an operating voltage potential sufficient for reading a memory cell. A Power-Supply-In-Package (PSIP) block may adjust a supply voltage in accordance with received data values and be used to power the flash memory block.

18 Claims, 2 Drawing Sheets

VARIABLE VOLTAGE SOURCE FOR A FLASH DEVICE OPERATING FROM A POWER-SUPPLY-IN-PACKAGE (PSIP)

BACKGROUND

Today's electronic products utilize circuits that can perform a variety of applications. Some of the applications include non-volatile semiconductor memory devices as a fundamental building block. The primary mechanism by which data may be stored in non-volatile memory is the memory cell. A typical prior flash memory cell may be comprised of a single Field Effect Transistor (FET) including a select gate, a floating gate, a source and a drain. Information may be stored in the flash cell by altering the amount of charge on the floating gate, which causes the threshold voltage of the flash cell to be varied. A typical prior art flash memory cell may be in one of two possible states, being either "programmed" or "erased."

According to one prior method, when a flash cell is read, the current conducted by the flash cell may be compared to a current conducted by a reference flash cell having a threshold voltage set to a predetermined reference voltage having a value in the separation range. A single comparator may make the comparison and output the result. When a flash cell is selected for reading, a biasing voltage may be applied to the select gate and the same biasing voltage may be applied to the select gate of the reference cell. If the flash cell is programmed, the electrons trapped on the floating gate increase the threshold voltage such that the selected flash cell conducts less drain current than the reference flash cell. If the prior flash cell is erased, little or no excess electrons may be on the floating gate and the flash cell may conduct more drain-source current than the reference cell.

The biasing voltage applied to the select gate in a read operation should be at the proper value in order to determine whether the memory cell is "programmed" or "erased." Thus, there is a continuing need for better ways to supply a biasing voltage to the flash memory that allows applications using flash memory to operate properly.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements illustrated in the figures have not necessarily been drawn to scale. For example, the dimensions of some of the elements are exaggerated relative to other elements for clarity.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

The architecture presented in the embodiments of the invention may have applications to products in portable computing, networking, digital camera applications, wireless technology and a wide range of consumer products based on instrumentation and automotive applications. It should be further understood that the circuits disclosed herein may be used in many systems that include, by way of example only, cellular radiotelephone communication systems, Personal Communication Systems (PCS), modems, two-way radio communication systems, one-way and two-way pagers, Personal Digital Assistants (PDA's) and other hand held devices. Although not shown, the system may include a display device, a keyboard, a cursor control device, a hard copy device, or a sound sampling device when used in a computer. The specific components and configuration of the computer system may be determined by the particular applications for which the computer system may be used.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Figure 1:
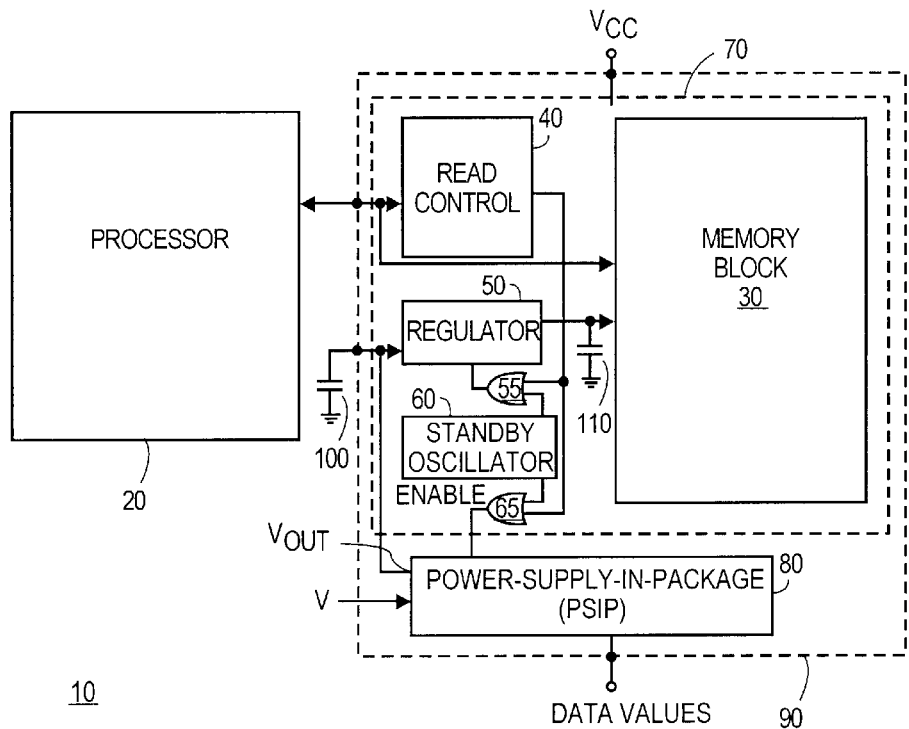
FIG. 1 is a block diagram that includes a processor and a memory block that receives a regulated operating voltage from a regulator in accordance with an embodiment of the present invention.

FIG. 1 is a block diagram of a system 10 that may include a processor 20 and a memory block 30 that has low active and standby power in accordance with an embodiment of the present invention. Processor 20 may be a microprocessor, a microcontroller, a Reduced Instruction Set Computing (RISC) processor, an ARM™ core from ARM Holdings in Cambridge, England, a StrongARM™ core or an XScale™ core from Intel Corporation in Santa Clara, Calif., or an embedded core, although the scope of the present invention is not limited in this respect. Unless specifically stated otherwise, as apparent from the following discussions, it is appreciated that throughout the specification the invention relates to the action and/or processes of generating an operating voltage for memory block 30 that is appropriate for reading the programmed data. However, the present invention has applications in a variety of products.

A device 70 includes a read control block 40, a regulator 50, logic gates 55 and 65, and a standby oscillator 60 that may be integrated with memory block 30, and the combination protected from the environment by a package 90. Alternatively, without narrowing the scope of the present invention, read control block 40, regulator 50, logic gates 55 and 65 and standby oscillator 60 may be off-chip, i.e., not integrated on the same semiconductor die as memory block 30. A power supply block, also referred to as a Power-Supply-In-Package (PSIP) 80, may receive a voltage potential (V) ranging from about 1 volt to about 3.6 volts and provide regulator 50 with a configurable supply voltage that ranges from about 4 volts to about 6 volts. Alternatively, PSIP 80 may receive a voltage potential ranging from about 4 volts to about 6 volts and provide regulator 50 with a configurable supply voltage that ranges from about 1 volt to about 3.6 volts. It should be noted that neither the input voltage potential value nor the output supply voltage value limits the scope of the present invention.

Package 90 provides protection for memory block 30, read control block 40, regulator 50, standby oscillator 60 and PSIP 80, and may include plastic packaging, ceramic packaging, Chip-on-Board (COB), Direct-Chip-Attach (DCA), Chip-Scale-Packages (CSPs), or others. Package 90 may include lead frames, wire bonds, flip-chip and ball bonding, or glob top sealing. It is intended that neither the materials used in the package nor the methods for providing electrical contacts limit the scope of the present invention.

A capacitor 100 may be connected to the output terminal of PSIP 80 to store energy and provide a supply voltage of about 6 volts. Capacitor 100 may have a capacitance value ranging from about 10 microfarads to about 10 nanofarads, although this is not a limitation of the present invention. Alternatively, capacitor 100 may be formed having a high k dielectric and integrated with read control block 40, regulator 50 and memory block 30. In another embodiment, capacitor 100 may be placed within PSIP 80, although the placement of capacitor 100 is not a limitation of the present invention.

Although not shown, it should be noted that in some applications PSIP 80 may generate a supply voltage that may be provided to electronic devices outside of package 90. In these applications, PSIP 80 may provide a current based on a sum of the currents conducted by the electronic devices. The selection of either PSIP 80 or an external power supply to provide the supply voltage may be determined by a value of a data bit stored in a latch or register that may be changed under software control. The latch or register may be located within processor 20 or may be included with the semiconductor devices within package 90. It is not intended that the location of the latch or register be a limitation of the present invention. It should be understood that by design, either PSIP 80 or the external source may be designated as the default to supply the operating potential in a power-up sequence. Thus, the stored data bit may determine whether PSIP 80 or an external source supplies regulator 50 with the operating potential. Following power-up and a time period that allows voltage potentials to stabilize, a signal may be provided to indicate that the word line paths in memory block 30 have charged to the read levels, enabling data to be read from the memory and used by processor 20. The word line path provides access to the gate of the flash cells in the memory array.

An output of regulator 50 may be connected to memory block 30 to provide signals of about 4–6 volts to the memory, although the value of the signal is not limiting to the scope of the present invention. Thus, read signals to the memory cells may transition between about zero volts (ground potential) and the 4 to 6 volt level. Note that the read signal is the voltage supplied to the gates of selected flash cells when the data stored by the flash cells is being read. It should be understood that capacitor 110 shown in FIG. 1 represents the gate capacitance of transistors (not shown) and the capacitance of interconnect routing associated with the read signal. Capacitor 110 may have a value, for example, that is within the range of about 100 picofarads to about 10,000 picofarads, although this capacitance range does not limit the scope of the present invention.

Read control block 40 may provide a signal that is OR'ed with a signal generated by standby oscillator 60, and the output signal of OR-gate 55 supplied to regulator 50. The signal from read control block 40 may also be OR'ed with another signal from standby oscillator 60, and the output ENABLE signal of OR-gate 65 supplied to PSIP 80. Thus, standby oscillator 60 may generate two signals, with one signal used by PSIP 80 to control the charge supplied to capacitor 100 and the other signal used by regulator 50 to control the charge supplied to capacitor 110.

Memory block 30 may be used to store messages transmitted to or by system 10. Memory block 30 may also optionally be used to store instructions that are executed by processor 20 during operation, and may be used to store user data such as the conditions for when a message may be transmitted. In one embodiment, the memory cells in memory block 30 may be flash cells. The flash cell may be a multi-level flash cell capable of being in one of several analog states, and the state of the flash cell may be indicated by one or more binary bits, with the states separated by a separation range.

By way of example, the first state may encompass the lowest range of voltages and may be indicated by two bits, with both bits being logic 1's in an erased mode. The second and third states may be indicated by logic values of 01 and 10 and the fourth state may be indicated by both bits being logic 0's in a programmed mode. Alternatively, both bits being logic 0's may indicate the lowest range of voltages and the highest range of voltages may be indicated by both bits being logic 1's. It should be noted that the type of memory cell or the number of states does not limit the scope of the present invention.

A non-volatile memory cell that has a floating gate may behave as a field effect transistor having a threshold voltage that may increase as charge is added to the floating gate. There may be a number of different ways to sense the amount of charge stored on the floating gate of the memory cell. Methods include sensing the cell current of a memory cell when a constant voltage is applied to the select gate of the memory cell, sensing the amount of voltage at the select gate to give rise to an expected cell current for the memory cell, among others. The scope of the present invention is not limited by the method used to sense the amount of charge stored on the floating gate of the memory cell.

Figure 2:
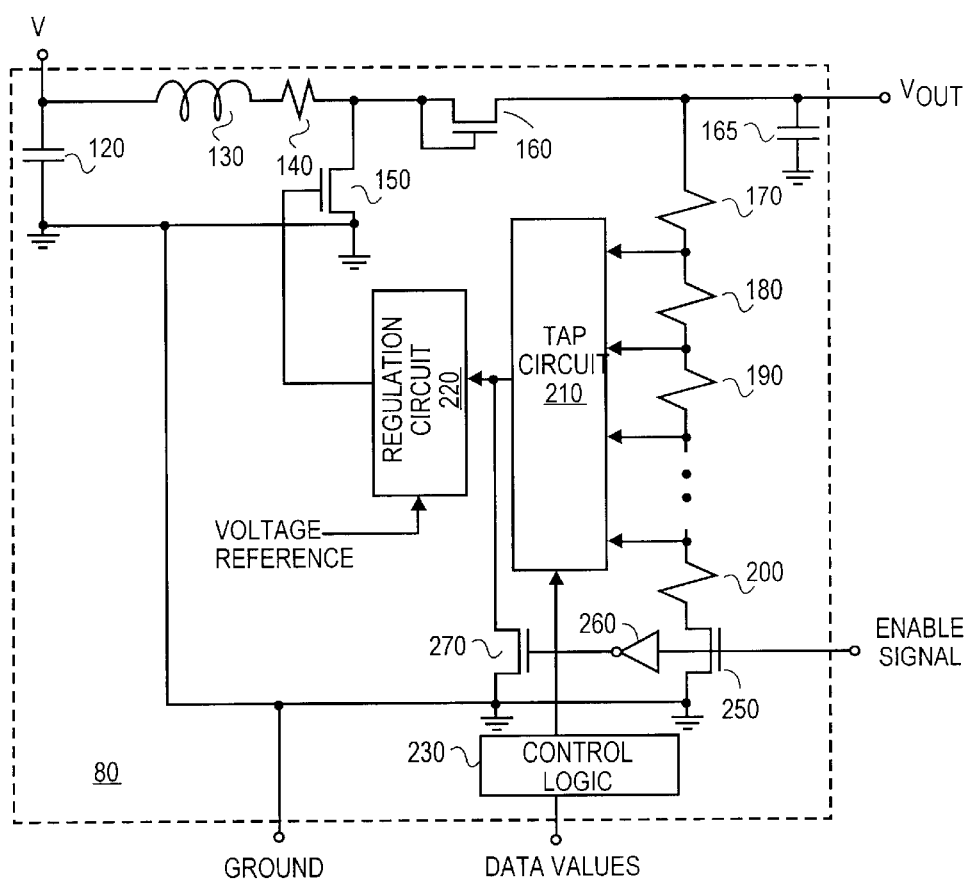
FIG. 2 is a schematic for a Power-Supply-In-Package (PSIP) as illustrated in FIG. 1.

FIG. 2 is a schematic diagram of PSIP 80 as shown in FIG. 1. PSIP 80 may receive a voltage potential (V) ranging from about 1 volt to about 3.6 volts at one terminal of an inductor 130. Inductor 130 may be provided as an external component of PSIP 80 or integrated as part of PSIP 80, with either embodiment included in the present invention. A resistor 140 represents the resistance of inductor 130 and may be shown connected in series with inductor 130. A semiconductor PN junction device such as, for example, diode-connected transistor 160, may be coupled between a terminal of resistor 140 and an output node or terminal that provides the signal $V_{OUT}$. A capacitor 165 may be connected to the output terminal. A number of resistors may be coupled between the output node and a reference potential such as, for example, ground. Resistors 170, 180, 190, . . . , 200 form a resistor voltage-divider having tap points between the resistors. Note that any sensing scheme such as, for example, a capacitor voltage-divider network may be used instead of the resistor voltage-divider.

A control logic block 230 receives data values through data terminals of PSIP 80 that may be latched and used to provide select signals to a tap circuit 210. Tap circuit 210 may have inputs connected to the tap points of the resistor voltage-divider. A regulation circuit 220 may have an input connected to an output of tap circuit 210 and another input to receive an internal REFERENCE VOLTAGE signal. An output of regulation circuit 220 may be connected to a control terminal of a transistor 150. The first current conduction terminal of transistor 150 may be coupled to the common connection of resistor 140 and diode-connected transistor 160 and the second current conduction terminal may be coupled to a reference potential such as, for example, ground.

The first current conducting terminal of a transistor 250 may be connected to an end of the voltage-divider, i.e., to a terminal of resistor 200. The second current conducing terminal of transistor 250 may be connected to ground. The control terminal of transistor 250 may be coupled to receive an enable signal from OR-gate 65 (see FIG. 1). An inverter 260 may couple the control terminal of transistor 250 to the control terminal of transistor 270. The conduction terminals of transistor 270 may couple the output of tap circuit 210 to ground.

Figure 3:
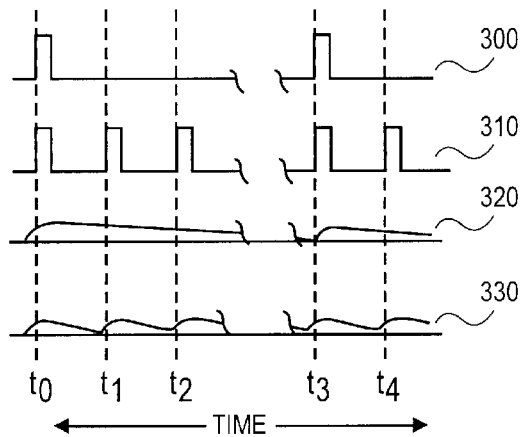
FIG. 3 is a timing diagram for signals generated by a standby oscillator and supplied to the regulator and a Power-Supply-In-Package (PSIP) as illustrated in FIG. 1.

FIG. 3 is a timing diagram for the two signals generated by standby oscillator 60 and supplied to regulator 50 and PSIP 80 (see FIG. 1). The horizontal axis represents time and the vertical axis represents a voltage. In particular, waveform 300 illustrates the timing for the signal that may be supplied to PSIP 80 to control the charging of capacitor 100. Waveform 320 illustrates that the charge stored on capacitor 100 may be replenished at times $t_0$ and $t_3$. Waveform 310 illustrates the timing for the signal that may be supplied to regulator 50 to control the time at which charge is supplied to capacitor 110. Waveform 330 illustrates that the charge stored on capacitor 110 may be replenished at times $t_0$, $t_1$, $t_2$, $t_3$ and $t_4$.

Operating in the read mode (referring to FIGS. 1 and 3), read control block 40 may provide a signal through OR-gate 55 to regulator 50 and through OR-gate 65 to PSIP 80. In response to the received signal, PSIP 80 may generate a supply voltage of about 6.0 volts and provide a current of about 500 microamps to regulator 50. About 90 to 100 microamps of this current may be consumed in circuitry within regulator 50, and roughly, the remaining 400 microamps of current may be used in charging capacitor C110. By keeping capacitor 110 charged to a operating voltage of about 5.4 volts, a word line signal at the proper biasing voltage may be supplied to memory block 30. Thus, read control block 40, regulator 50, standby oscillator 60 and PSIP 80 cooperate to supply word lines having about 5.4 volts levels to the select gate of the selected flash cells of memory block 30. By providing a proper voltage level, the "erased" value or "programmed" value stored in the flash cell may be correctly determined.

Operating in the standby mode, device 70 may receive a supply voltage from PSIP 80. The power consumed in the standby mode may be reduced to conserve battery strength for portable system 10 by using the two signals generated by standby oscillator 60, one signal for regulator 50 and the other signal for PSIP 80. In particular, a signal like the one illustrated by waveform 300 may be generated by standby oscillator 60 and supplied to PSIP 80 to control the charge stored on capacitor 100. This signal may be a pulse supplied at a 30 millisecond rate that may be active for about 20 microseconds, although this is not a limitation of the present invention. During the 20 microsecond active time, PSIP 80 may restore charge on capacitor 100, and thus, provide a supply voltage to regulator 50 in a range, for example, of about 5.6 volts to about 6 volts.

Another signal, like the one illustrated by waveform 310, may be generated by standby oscillator 60 and supplied to regulator 50 to control the charge stored on capacitor 110. This signal may be a pulse that may be active for about 3 microseconds supplied at a rate that ranges from about 600 microseconds to about 900 microseconds, although this is not a limitation of the present invention. During the 3 microsecond active time, regulator 50 may restore the charge on capacitor 110 to maintain the voltage level of word lines supplied to memory block 30 in the range of about 5.2 volts to about 5.4 volts. Thus, in the standby mode, standby oscillator 60 may supply a signal used by regulator 50 to periodically replace the parasitic leakage current that discharges capacitor 110. In effect, capacitor 110 may be charged by partially discharging capacitor 100.

In one embodiment, the signal provided to regulator 50 may be about 35 times higher in frequency than the signal provided to PSIP 80, although this is not a limitation of the present invention. Thus, the signal generated by standby oscillator 60 may replenish the charge stored on capacitor 110 more frequently than charge stored on capacitor 110. By incorporating these two separate signals to separately control the charging of capacitors 100 and 110, memory block 30 may have with a low power consumption in the standby mode.

The operation of PSIP 80 may be described with reference to FIG. 2. An ENABLE signal allows transistor 150 to alternately switch between a conductive state and a nonconductive state. When transistor 150 is being switched, the voltage generated by a changing current flowing through inductor 130 may be used to increase the charge stored on capacitor 110 (see capacitor 110 in FIG. 1). A feedback loop may sense the voltage $V_{OUT}$ and control the switching of transistor 150, and thereby, control the charge stored on capacitor 110. More specifically, resistors 170–200 may form a voltage-divider having tap points from which a tap voltage may be selected. The tap voltage, selected by tap circuit 210, may be passed to regulation circuit 220.

Regulation circuit 220 compares the tap voltage with a VOLTAGE REFERENCE to control the conduction of transistor 150. By way of example, the VOLTAGE REFERENCE may have a value of about 1.3 volts and the tap voltage received from tap circuit block 210 may have a value of about 1.0 volts. In this example, the supply voltage $V_{OUT}$ may be determined to have a value that is below a desired supply voltage and transistor 150 may alternately be switched between the conductive and nonconductive state. The changing current in inductor 130 provides additional charge that may be stored on capacitor 110. Thus, the supply voltage $V_{OUT}$ may be increased until the desired supply voltage is reached.

In another example, the VOLTAGE REFERENCE may have a value of about 1.3 volts and the tap voltage received from tap circuit block 210 may have a value of about 1.4 volts. In this example, the supply voltage $V_{OUT}$ may be determined to have a value that is above the desired supply voltage and transistor 150 is not switched between the conductive state and the nonconductive state. In this example, additional charge is not stored on capacitor 110 and the supply voltage $V_{OUT}$ is not increased.

Control logic block 230 may be used along with the resistor voltage-divider and tap circuit block 210 to set the value of $V_{OUT}$ and further control the granularity of changes provided in the supply voltage $V_{OUT}$. Control logic block 230 has inputs to receive data values that may either be hard wired data values or programmed data values provided using microcode under software control of system 10. Small adjustments to the supply voltage $V_{OUT}$ may be provided using a resistor voltage-divider having multiple tap points. By way of example, a resistor voltage-divider having four tap points may use two data values to select the tap voltage, while a resistor voltage-divider having eight tap points may use three data values to select the tap voltage. Thus, the design of control logic block 230, tap circuit block 210 and the resistor voltage-divider control the granularity of changes provided in the supply voltage $V_{OUT}$.

In additional to the granularity provided for the value $V_{OUT}$, the desired value for $V_{OUT}$ may be adjusted up or down by providing a new data value to control logic block 230. The new data value provides a new tap voltage selected from another tap point in the resistor voltage-divider. The new tap voltage is compared with the VOLTAGE REFERENCE and transistor 150 switched accordingly. Thus, the supply voltage $V_{OUT}$ may be adjusted to reach a desired voltage. Upon reaching the desired voltage, the tap voltage and the VOLTAGE REFERENCE value may have equal values. Note that transistors 250 and 270, in accordance with the ENABLE signal, determine when PSIP 80 may make adjustments to the supply voltage $V_{OUT}$.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A device, comprising:
   an inductor having a first end coupled to an input terminal to receive an input voltage and a second end coupled to an output node to supply an output current, wherein a portion of the output current generates a selectable feedback voltage to compare with a voltage reference to control the output current;
   a voltage divider coupled between the output node and a around terminal, wherein the voltage divider receives the portion of the output current;
   a tap circuit having inputs coupled to tap points of the voltage divider; and
   a control block to receive data values to select one of the tap points.

2. The device of claim 1, further comprising:
   a regulation circuit to receive the voltage reference and the feedback voltage selected from one of the tap points; and
   a transistor having a control terminal coupled to the regulation circuit and current carrying terminals coupled to the second end of the inductor and the ground terminal.

3. The device of claim 2, wherein the inductor and transistor are formed on one semiconductor chip.

4. The device of claim 1, further comprising a semiconductor PN junction device coupled between the second end of the inductor and the output node.

5. A device, comprising:
   an inductor having a first terminal to receive a voltage and a second terminal coupled to an output of the device;
   a voltage-divider coupled between the output of the device and a ground terminal;
   a tap circuit having inputs coupled to tap points of the voltage-divider;
   a control block coupled to receive data values and provide a signal to the tap circuit to select a tap point;
   a regulation circuit to receive a voltage reference and a tap voltage from the tap point; and
   a first transistor having a control terminal coupled to the regulation circuit and current carrying terminals coupled between the second terminal of the inductor and the ground terminal.

6. The device of claim 5, wherein the inductor and transistor are integrated on a same semiconductor chip.

7. The device of claim 5, further comprising a diode having a first end coupled to the second terminal of the inductor and a second end coupled to the output of the device.

8. The device of claim 5, wherein the voltage-divider includes a plurality of series connected resistors.

9. The device of claim 8, wherein the voltage-divider further includes a second transistor having a control terminal to receive an enable signal, a first current conducting terminal coupled to an end resistor in the plurality of series connected resistors and a second current conducting terminal coupled to the ground terminal.

10. A device that includes an inductor, a transistor and a voltage-divider having tap points, comprising:
    a first pin coupled to a first terminal of the inductor and further coupled to receive a voltage potential;
    a second pin coupled to a second terminal of the inductor to provide an output current, and further coupled to a first end of the voltage-divider;
    a reference pin coupled to a second end of the voltage-divider; and
    a plurality of pins to receive data values used to select a tap voltage from one of the tap points to compare with a voltage reference to control the transistor switching the output current from the second pin to the reference pin.

11. The device of claim 10, further including:
    a tap circuit having inputs coupled to the tap points; and
    a control logic block to receive the data values that are used to select the tap voltage.

12. The device of claim 11, further including a regulation circuit having an input to receive the tap voltage and an input to receive a voltage reference and an output to provide a comparison result.

13. The device of claim 12, wherein a control terminal of the transistor is coupled to the output of the regulation circuit.

14. The device of claim 10, further including a diode coupled between the second terminal of the inductor and the second pin.

15. The device of claim 10, wherein the inductor is formed on a same semiconductor die as the transistor.

16. A method, comprising:
    providing a current from an input pin through an inductor to generate a voltage potential at an output;
    using data values to select a tap point on a voltage-divider to feedback a portion of the voltage potential to compare against a voltage reference; and
    changing the voltage potential until the comparison shows the portion of the voltage potential substantially equal to the voltage reference.

17. The method of claim 16, further comprising programming the voltage potential to a desired value by using different data values to select a different tap point on the voltage-divider to feedback a different portion of the voltage potential.

18. The method of claim 16, further comprising enabling the voltage-divider with an enabling signal when changing the voltage potential at the output.

* * * * *